United States Patent
Hosoi et al.

(10) Patent No.: US 6,841,885 B2
(45) Date of Patent: Jan. 11, 2005

(54) WIRING SUBSTRATE

(75) Inventors: Yoshihiro Hosoi, Kokubu (JP); Yasuo Fukuda, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/155,538

(22) Filed: May 24, 2002

(65) Prior Publication Data

US 2002/0175397 A1 Nov. 28, 2002

(30) Foreign Application Priority Data

May 25, 2001 (JP) ..................... P2001-157695

(51) Int. Cl.[7] .......... H01L 23/48; H01L 23/52
(52) U.S. Cl. ........ 257/778; 257/737; 257/738; 257/766; 257/703; 257/772
(58) Field of Search ................. 257/776, 778, 257/737, 738, 703, 772, 779, 787, 768, 769, 770, 771, 739–740, 766, 750, 752; 438/612, 650, 686, 613, 108

(56) References Cited

U.S. PATENT DOCUMENTS 5,838,069 A * 11/1998 Itai et al. .............. 257/766

FOREIGN PATENT DOCUMENTS

| JP | 2-104671 | 4/1990 | |
|---|---|---|---|
| JP | 4-349690 | * 12/1992 | |
| JP | 10-135606 | 5/1998 | |
| JP | 2000195989 | * 7/2000 | ......... H01L/23/12 |

* cited by examiner

*Primary Examiner*—Long Pham
*Assistant Examiner*—Dilinh Nguyen
(74) *Attorney, Agent, or Firm*—Hogan & Hartson LLP

(57) ABSTRACT

An object of the invention is to prevent the color on a surface of a plated metal layer from changing. The invention is a wiring substrate obtained by forming a wiring conductor made of a metal having a high melting point on an insulator, and coating a surface of the wiring conductor with an electroless plated metal layer, wherein the electroless plated metal layer contains an element of Group 1B and is free from lead.

7 Claims, 5 Drawing Sheets

WIRING SUBSTRATE

BACKGROUND OF THE INVENTION

1. Field of the Invention

The present invention relates to a wiring substrate on which an electronic component such as a semiconductor element, a capacitive element, a resistor or the like is mounted, and that includes a wiring conductor on its surface, the wiring conductor being coated with a plated metal layer by electroless plating. The invention also relates to a method for producing the same.

2. Description of the Related Art

Conventionally, a wiring substrate on which an electronic component such as a semiconductor element, a capacitive element, a resistor or the like is to be mounted generally includes a substantially rectangular plate-shaped insulator and a plurality of wiring conductors. The insulator is made of an aluminum oxide sintered body and has a mounting portion for mounting an electronic component. The plurality of wiring conductors are made of a metal material having a high melting point such as tungsten, molybdenum or manganese are formed so as to lead from the mounting portion to the outer circumference of the insulator. An electronic component such as a semiconductor element, a capacitive element and a resister is mounted on the mounting portion of the insulator, and each electrode of the electronic component is electrically connected to the wiring conductor via a conductive connecting member such as a solder and a bonding wire.

In such a wiring substrate, a portion of the wiring conductor that is led out to the outside is connected to a circuit wiring of an external electrical circuit board via a solder or the like, so that the wiring substrate is mounted on the external electrical circuit, and each electrode of the electronic component mounted on the wiring substrate is electrically connected to a predetermined external electrical circuit.

Furthermore, in such a wiring substrate, the surface of the wiring conductor is coated with a plated metal layer such as nickel to improve the wettability and the bonding properties of solders and bonding wires with respect to the wiring conductor made of a metal material having a high melting point.

As a method for forming a coating of a plated metal layer such as nickel, electroless plating, which does not require leads, has come to be used more commonly, because higher density of the wiring conductors resulting from compactness of the wiring substrate makes it difficult to form leads for supplying power for plating.

A coating of a plated metal layer such as nickel on the wiring conductors by electroless plating is formed by the following method. Since metals having a high melting point such as tungsten, molybdenum or manganese do not have catalytic activity with respect to reduction precipitation of metals such as nickel by electroless plating (autocatalytic type), in general, first, the surface of the wiring conductor is coated with an element having catalytic activity with respect to precipitation of nickel or the like, such as an element of Group 1B (copper, silver, or gold), to provide the surface thereof with catalytic activity. Thereafter, the wiring conductor is immersed in an electroless plating solution so that the surface is coated with a plated metal layer by the action of the catalytic activity of the element of Group 1B. In general, this method is performed in the following manner.

First, an insulator having wiring conductors on its surface is prepared.

Next, the wiring conductors are immersed in an active liquid obtained by adding additives such as a pH adjuster and a complexing agent to an aqueous solution containing at least a metal compound that serves as a supply source of an element of Group 1B such as copper chloride, and a lead compound such as lead chloride, so that the element of Group 1B such as copper is precipitated on the surface of the wiring conductor for coating. Then, the wiring conductor is immersed in an active liquid obtained by adding additives such as a complexing agent and a pH adjuster to an aqueous solution containing at least a metal compound that serves as a supply source of a plated metal such as nickel sulfide or nickel chloride, and a lead compound such as lead chloride, so that the element of Group 1B such as copper is precipitated on the surface of the wiring conductor for coating.

Then, the wiring conductors are immersed in an electroless plating solution obtained by adding a completing agent, a pH buffer, a stabilizer and the like to an aqueous solution containing at least a nickel compound that serves as a supply source of nickel such as nickel sulfide or nickel chloride, and a reductant such as sodium hypophosphite or dimethylamine borane, so that the nickel in the plating solution is reduced and precipitated by the action of the catalytic activity of the element of Group 1B such as copper that is coating the surfaces of the wiring conductors, so that a nickel plated metal layer is formed selectively only on the surfaces of the wiring conductors.

The lead compound contained in the active liquid is first adsorbed on the surface of the wiring conductor when the wiring conductors made of a metal having a high melting point are immersed in the active liquid, and the lead compound acts so as to make the surfaces of the conductors sensitive to the precipitation and the coating of the element of Group 1B such as copper. Thus, the lead compound facilitates the precipitation and the coating of the element of Group 1B such as copper on the wiring conductors and makes it possible to form a uniform coating. Furthermore, the element of Group 1B such as copper coating the surface of the wiring conductor and the lead remain and are contained in the electroless plated metal layer coating the surfaces of the wiring conductors.

Another method for forming a coating of a plated metal layer such as nickel and copper on the wiring conductor by electroless plating is as follows. Since metals having a high melting point such as tungsten, molybdenum or manganese do not have catalytic activity with respect to reduction and precipitation by electroless plating (autocatalytic type) of metals such as nickel or copper, in general, first, the surface of the wiring conductor is coated with a platinum group metal such as palladium or platinum to provide the surface thereof with catalytic activity. Thereafter, the wiring conductor is immersed in an electroless plating solution so that the surface is coated with a plated metal layer. In general, this method is performed in the following manner.

First, an insulator having wiring conductors on its surface is prepared.

Next, the wiring conductors are immersed in an active liquid obtained by adding additives such as a pH adjuster such as sodium hydroxide or potassium hydroxide to an aqueous solution containing at least a metal compound that serves as a supply source of a platinum group metal such as palladium chloride, and a lead compound such as lead chloride, so that the platinum group metal such as palladium is precipitated on the surface of the wiring conductor for coating.

Then, the wiring conductors are immersed in an active liquid obtained by adding a complexing agent, a pH buffer, a stabilizer and the like to an aqueous solution containing at least a metal compound that serves as a supply source of a plated metal such as nickel sulfide or copper sulfide, and a reductant such as sodium hypophosphite, dimethylamine borane, formalin, so that a metal such as nickel or copper is reduced and precipitated by the action of the catalytic activity of the platinum group metal such as palladium coating the surfaces of the wiring conductors, so that a plated metal layer is formed selectively only on the surfaces of the wiring conductors.

The lead compound contained in the active liquid is first adsorbed on the surface of the wiring conductor when the wiring conductors made of a metal having a high melting point is immersed in the active liquid, and thus the lead compound acts so as to make the surfaces of the conductors sensitive to the precipitation and the coating of the platinum group metal such as palladium. Thus, the lead compound facilitates the precipitation and the coating of the platinum group metal such as palladium or platinum on the wiring conductors and makes it possible to form a uniform coating. Furthermore, the platinum group metal such as platinum or palladium coating the surface of the wiring conductor and the lead remain and are contained in the electroless plated metal layer coating the surfaces of the wiring conductors.

The conventional wiring substrate contains lead in the plated metal layer, as described above, so that when heat is applied to the plated metal layer, the lead moves and is diffused onto the surface of the plated metal layer and oxidized there, which causes a functional problem that the color is changed spottedly and environmental and security problems that the lead in the plated metal layer harms the human body.

Furthermore, it can be one solution not to let lead contained in the active liquid in order to solve the problems. However, in this case, since the surface of the wiring conductor made of a metal having a high melting point is not sufficiently sensitive to the precipitation and the coating of elements of Group 1B such as copper or platinum group metals such as palladium or platinum, the elements of Group 1B cannot be precipitated on the surfaces of the wiring conductors uniformly and firmly for coating. As a result, roughness, cracks, swelling or the like may be generated.

SUMMARY OF THE INVENTION

The invention is devised to solve the problems, and an object of the invention is to provide a wiring substrate in which a wiring conductor is coated with an electroless plated metal layer uniformly and firmly, and the plated metal layer is free from lead so that the problem of a spotted color change is not caused, and the human body is not harmed.

The invention relates to a wiring substrate obtained by forming a wiring conductor made of a metal having a high melting point on an insulator, and coating a surface of the wiring conductor with an electroless plated metal layer, wherein the electroless plated metal layer contains an element of Group 1B and is free from lead.

The invention also relates to a method for producing a wiring substrate, comprising the steps of:

(1) preparing an insulator in which a wiring conductor made of a metal having a high melting point is formed on its surface;

(2) immersing the wiring conductor in an active liquid containing at least an element of Group 1B and a hydroxy carboxylic acid to coat a surface of the wiring conductor with the element of Group 1B to provide catalytic activity; and (3) immersing the wiring conductor in an electroless plating solution to coat the surface of the wiring conductor with an electroless plated metal layer.

According to the invention, the electroless plated metal layer coating the wiring conductor contains an element of Group 1B that is necessary to form a coating of the electroless plated metal layer, but does not contain lead. Therefore, the function of the element of Group 1B provides the wiring conductor with satisfactory catalytic activity, so that only the wiring conductor is coated with the electroless plated metal layer uniformly, and the problems of a spotted color change of the plated metal layer caused by the lead contained in the plated metal layer and the harm to the human body can be prevented effectively.

In the invention it is preferable that the insulator is made of an aluminum oxide sintered body, an aluminum nitride sintered body, a mullite sintered body, or silicon carbide sintered body, the wiring conductor is made of tungsten, molybdenum, or manganese, the electroless plated metal layer is made of a high purity nickel containing nickel in a content of 99.9 wt % or more, a nickel-phosphorus alloy or a nickel-boron alloy.

In the invention, it is preferable that the surface of the electroless plated metal layer is coated with a gold plated layer.

In the invention, it is preferable that the insulator is made of an aluminum oxide sintered body, an aluminum nitride sintered body, a mullite sintered body, or silicon carbide sintered body, and the wiring conductor is made of tungsten, molybdenum, or manganese.

In the invention, it is preferable that the element of Group 1B is at least one selected from the group consisting of copper, silver and gold, the hydroxy carboxylic acid is at least one selected from the group consisting of citric acid and malic acid, the electroless plated metal layer is made of a high purity nickel containing nickel in a content of 99.9 wt % or more, a nickel-phosphorus alloy or a nickel-boron alloy.

In the invention, it is preferable that the concentration of the element of Group 1B in the active liquid is 20 to 80 ppm.

The invention relates to a wiring substrate obtained by forming a wiring conductor made of a metal having a high melting point on an insulator, and coating a surface of the wiring conductor with an electroless plated metal layer, wherein the electroless plated metal layer contains a platinum group metal and is free from lead.

The invention also relates to a method for producing a wiring substrate, comprising the steps of:

(1) preparing an insulator including a wiring conductor made of a metal having a high melting point on its surface;

(2) immersing the wiring conductor in an active liquid containing at least a platinum group metal and a hydroxy carboxylic acid to coat a surface of the wiring conductor with the platinum group metal to provide catalytic activity; and (3) immersing the wiring conductor in an electroless plating solution to coat the surface of the wiring conductor with an electroless plated metal layer.

According to the invention, the electroless plated metal layer coating the wiring conductor contains a platinum group metal that is necessary to form a coating of the electroless plated metal layer, but does not contain lead. Therefore, the function of the platinum group metal provides the wiring conductor with satisfactory catalytic activity, so that only the wiring conductor is coated with the electroless plated metal layer uniformly, and the problems of a spotted color change of the plated metal layer caused by the lead contained in the plated metal layer and the harm to the human body can be prevented effectively.

In the invention, it is preferable that the insulator is made of an aluminum oxide sintered body, an aluminum nitride sintered body, a mullite sintered body, or silicon carbide sintered body, the wiring conductor is made of tungsten, molybdenum, or manganese, the electroless plated metal layer is made of a high purity nickel containing nickel in a content of 99.9 wt % or more, a nickel-phosphorus alloy, a nickel-boron alloy, copper, or an alloy containing copper as a main component.

In the invention, it is preferable that the surface of the electroless plated metal layer is coated with a gold plated layer.

In the invention, it is preferable that the insulator is made of an aluminum oxide sintered body, an aluminum nitride sintered body, a mullite sintered body, or silicon carbide sintered body, and the wiring conductor is made of tungsten, molybdenum, or manganese.

In the invention, it is preferable that the platinum group metal is at least one selected from the group consisting of palladium, platinum, rhodium, ruthenium, and iridium, the hydroxy carboxylic acid is at least one selected from the group consisting of citric acid and malic acid, the electroless plated metal layer is made of a high purity nickel containing nickel in a content of 99.9 wt % or more, a nickel-phosphorus alloy or a nickel-boron alloy.

In the invention, it is preferable that the concentration of the platinum group metal in the active liquid is 20 to 80 ppm.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
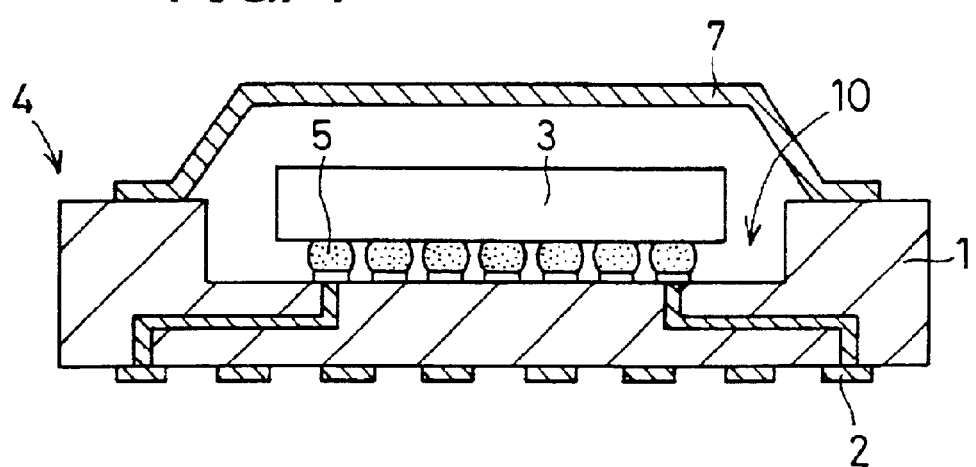
FIG. 1 is a sectional view showing an example of a wiring substrate of a first embodiment of the invention.

Now referring to the drawings, preferred embodiments of the invention are described below.

FIG. 1 is a sectional view showing an example of a wiring substrate of a first embodiment of the invention that is applied to a semiconductor element accommodation package for accommodating a semiconductor element. Reference numeral 1 denotes an insulator, and reference numeral 2 is a wiring conductor. The insulator 1 and the wiring conductor 2 constitute a wiring substrate 4 for mounting a semiconductor element 3.

The insulator 1 is made of an electrically insulating material such as an aluminum oxide sintered body, an aluminum nitride sintered body, a mullite sintered body, or silicon carbide sintered body, and has a mounting portion for mounting the semiconductor element 3 on its upper surface. The wiring conductor 2 made of a metal having a high melting point such as tungsten, molybdenum, manganese and other various metals is formed on the insulator 1 from the mounting portion on which the semiconductor element 3 is to be mounted to the lower surface thereof.

In the insulator 1, the semiconductor element 3 is mounted on the mounting portion and each electrode of the semiconductor element 3 is electrically connected to the wiring conductor 2 that is exposed to the mounting portion via a solder ball 5. The portions of the wiring conductor 2 led out onto the lower surface of the insulator 1 are electrically connected to a circuit wiring of an external electrical circuit substrate via solders or the like.

Figure 2A:
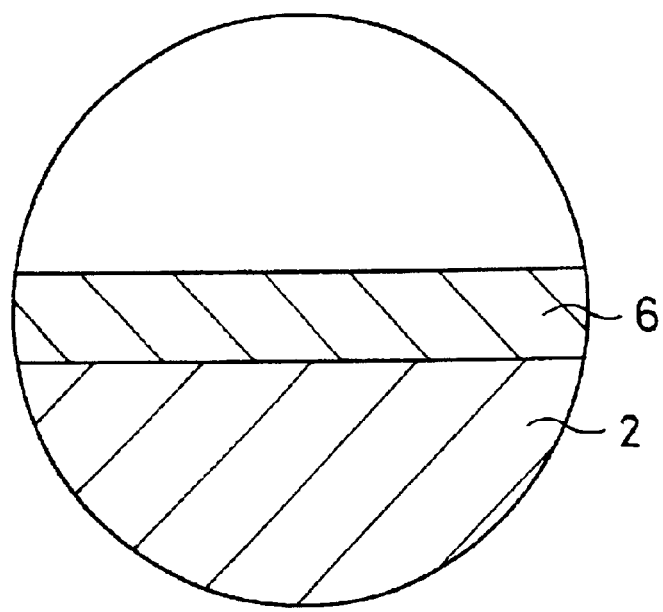
FIG. 2A is an enlarged sectional view showing an enlarged part of the wiring substrate shown in FIG. 1.

FIG. 2A is an enlarged sectional view showing an enlarged part of the wiring substrate 4 shown in FIG. 1. The surface of the wiring conductor 2 is coated with a plated metal layer 6 formed by electroless plating, as shown in the sectional view of FIG. 2A.

The plated metal layer 6 serves to improve the wettability, the joining strength and the bonding properties of solders with respect to the wiring conductor 2 and is made of high purity nickel that contains nickel in a content of 99.9 wt % or more, a nickel-phosphorus alloy, a nickel-boron alloy or the like.

It is important in the invention that the plated metal layer 6 contains an element of Group 1B and is free from lead.

This is important in order to prevent the problems that the lead contained in the plated metal layer 6 such as a nickel-boron plated layer moves and is diffused onto the surface of the plated metal layer 6 by heat or the like so that the color is changed spottedly, or the lead harms the human body. In this case, the element of Group 1B (copper, silver, or gold) allows the wiring conductor 2 to be coated with the plated metal layer 6 by electroless plating, and the element remains and is contained in the plated metal layer 6. However, compared to lead, the elements of Group 1B are hardly oxidized, and the toxicity is very low, so that the elements of Group 1B cannot move and is diffused onto the surface of the plated metal layer 6 so as to cause the spotted color change, nor harm the human body.

It is not necessary that the element of Group 1B is formed along the surface of the wiring conductor 2 in the form of a film, and it is sufficient that the element of Group 1B is formed uniformly at a substantially constant interval in the form of grains or fragments, for example, in portions along the grain boundaries the crystal grains of the metal having a high melting point of which the wiring conductor 2 is made. The element of Group 1B serves as the initiating point to coat the surface of the wiring conductor 2 with the plated metal layer 6 uniformly.

Figure 2B:
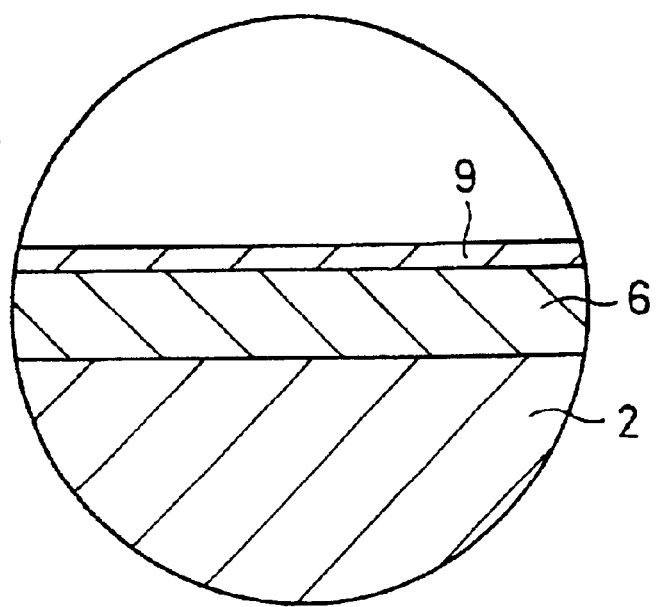
FIG. 2B is an enlarged sectional view showing a part of a variation of the wiring substrate of the first embodiment of the invention.

FIG. 2B is an enlarged sectional view showing a part of a variation of the wiring substrate 4 of the invention. In the wiring substrate 4, when the surface of the plated metal layer 6 made of pure nickel that contains nickel in a content of 99.9 wt % or more, a nickel-phosphorus alloy, a nickel-boron alloy or the like is coated with a gold plated layer 9, as shown in FIG. 2B, the plated metal layer 6 can be prevented from being oxidized and corroded effectively, and the wettability of the solder with respect to the wiring conductor 2 can be improved further. Therefore, it is preferable that the in the wiring substrate 4, the surface of the plated metal layer 6 is further coated with the gold plated layer 9. In this case, when the thickness of the gold layer 9 is less than 0.03 µm, the effect of coating the plated metal layer 6 is weak, and when the thickness exceeds 0.8 µm, a large amount of fragile intermetallic compounds is produced between tin in the solder and gold so that the joining strength of the solder tends to deteriorate. Consequently, it is preferable that the thickness of the gold plated layer 9 is in the range from 0.03 µm to 0.8 µm.

In this manner, in the wiring substrate 4 of the invention, the semiconductor element 3 is mounted on the mounting portion of the insulator 1, and each electrode of the semiconductor element 3 is electrically connected to the wiring conductor 2 via the solder ball 5. Thereafter, a bowl-shaped cover 7 made of a metal or ceramics is joined onto the upper surface of the insulator 1 with a sealing material such as glass, resin, wax material or the like so that the semiconductor element 3 can be accommodated airtightly in a container constituted with the insulator 1 and the cover 7. Thus, a semiconductor apparatus as a product can be completed.

Next, a method for producing the wiring substrate 4 will be described with reference to FIGS. 3A to 3C. The same components as those in FIGS. 1 and 2A bear the same numeral.

Figure 3A:
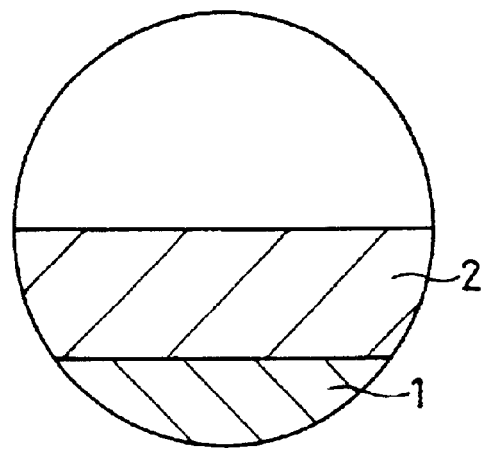
FIGS. 3A to 3C are enlarged sectional views of each process explaining a method for producing the wiring substrate shown in FIG. 1.

First, an insulator 1 provided with a wiring conductor 2 made of a metal having a high melting point on its surface as shown in FIG. 3A is prepared.

The insulator 1 is a substantially rectangular plate made of an electrically insulating material such as an aluminum oxide sintered body, an aluminum nitride sintered body, a mullite sintered body, a silicon carbide sintered body or the like, and has a mounting portion for mounting a semiconductor element on its upper surface, so that the semiconductor element is mounted on the mounting portion.

The insulator 1 is produced in the following manner in the case where the insulator 1 is made of an aluminum oxide sintered body. A suitable binder and a solvent are mixed with a raw material powder such as aluminum oxide, silicon oxide, calcium oxide and magnesium oxide so that a muddy liquid ceramic slurry is obtained. Next, the ceramic slurry is formed into a sheet form by a conventionally known sheet forming technique such as a doctor blade technique, calender rolling or the like, so that a ceramic green sheet (ceramic crude sheet) is obtained. Thereafter, the ceramic green sheet is formed into a suitable form by cutting or stamping processing, and a plurality of sheets are laminated. Finally, the laminated ceramic green sheet is fired at a temperature of about 1600° C. in a reducing atmosphere. Thus, the insulator 1 can be produced.

The wiring conductor 2 is made of a metal having a high melting point such as tungsten, molybdenum, and manganese. The wiring conductor 2 can be formed from the mounting portion of the insulator 1 to the lower surface thereof in the following manner. A metal paste is obtained by adding and mixing a suitable organic binder and a solvent to a metal powder having a high melting point such as tungsten, and the metal paste is previously applied to the ceramic green sheet that will become the insulator 1 so that a predetermined pattern is printed by conventionally known screen printing.

Figure 3B:
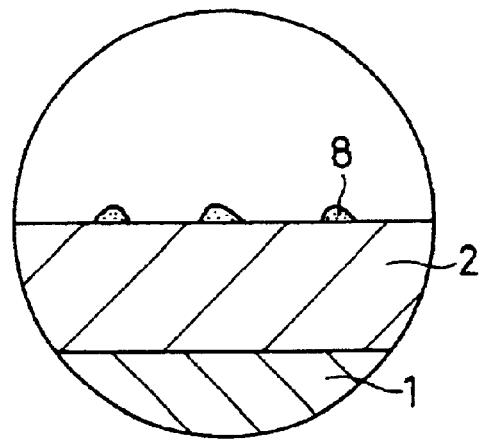

Next, the wiring conductor 2 is immersed into an active liquid containing at least one of the elements of Group 1B consisting of copper, silver and gold and at least one hydroxy carboxylic acid such as citric acid and malic acid, and as shown in FIG. 3B, the element 8 of Group 1B is formed on the surface of the wiring conductor 2 to provide catalytic activity. In FIG. 3B, the element of Group 1B is shown exaggerated than the actual scale for illustration.

In the active liquid, the element of Group 1B serves to provide the surface of the wiring conductor 2 with catalytic activity by coating the surface of the wiring conductor 2, and makes it possible to coat selectively and uniformly the surface of the wiring conductor 2 with the plated metal layer 6 in a subsequent process.

The hydroxy carboxylic acid has an important function of making it possible to coat the surface of the wiring conductor 2 with the element 8 of Group 1B without letting lead contained in the active liquid. More specifically, the hydroxy carboxylic acid such as citric acid acts on the surface of the wiring conductor 2 made of a metal having a high melting point such as tungsten so that the metal having a high melting point in the surface portion of the wiring conductor 2 is oxidized and complexed so as to be eluted in the active liquid, and that the element of Group 1B is reduced and precipitated by being substituted for tungsten or the like in the site from which the metal having a high melting point has been eluted. It seems that this occurs for the following reason: Regarding the stability of the complex with respect to a metal of the hydroxy carboxylic acid such as citric acid, the stability with respect to the metal having a high melting point such as tungsten is larger than that with respect to the element of Group 1B. Thus, the hydroxy carboxylic acid is added to the active liquid, so that the surface of the wiring conductor 2 can be coated with the element of Group 1B easily and uniformly without adding lead as a sensitizing agent to the active liquid.

When copper, for example, is used as the element of Group 1B, an aqueous solution containing at least a copper compound such as copper chloride or copper sulfide, and a hydroxy carboxylic acid (carboxylic acid having a hydroxyl group) such as citric acid or malic acid, to which additives such as a pH adjuster, for example, ammonia salts, hydrochloric acid, fluoroboric acid, sodium hydroxide, potassium hydroxide or the like are added, can be used as the active liquid. It is preferable that the concentration of the element of Group 1B in the active liquid is about 20 to 80 ppm, because a high concentration may induce a problem such as segregation of the element of Group 1B.

Figure 3C:
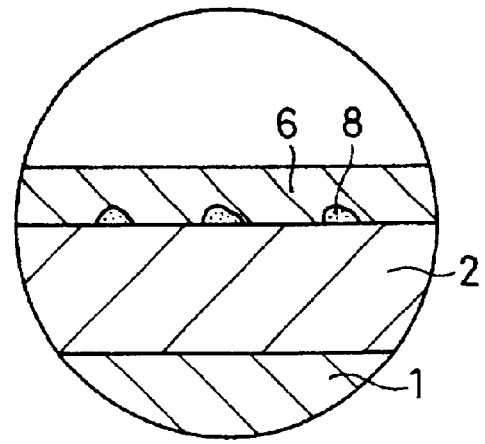

Then, the wiring conductor 2 is immersed in an electroless plating solution, so that the electroless plated metal layer 6 is precipitated on the surface of the wiring conductor 2 for coating, using the element 8 of Group 1B as a catalyst, as shown in FIG. 3C.

The plated metal layer 6 is made of pure nickel that contains nickel in a content of 99.9 wt % or more, a nickel-phosphorus alloy, a nickel-boron alloy or the like, and serves to improve the wettability, the bonding properties or the like of the solder with respect to the wiring conductor 2.

When the electroless plated metal layer 6 is made of, for example, a nickel-boron alloy, an electroless nickel plating solution containing at least a nickel compound that serves as a nickel supply source such as nickel sulfide, and a boron-based reductant such as dimethylamine boron, to which a complexing agent, a stabilizer, a pH buffer or the like are added, can be used as the electroless plating solution. In this case, the nickel ions in the electroless nickel plating solution are reduced to metal nickel, which occurs together with oxidation and degradation of the reductant by the catalytic action of the element 8 of Group 1B that has been previously formed on the surface of the wiring conductor 2 for coating. Then, the surface of the wiring conductor 2 is eutectically coated with the metal nickel together with boron produced from the degradation of the reductant, so that the plated metal layer 6 made of a nickel-boron alloy can be formed. Once that the surface of the wiring conductor 2 is started to be coated with nickel or the nickel-boron alloy, the coated nickel itself has catalytic activity for subsequent reduction and precipitation of nickel with the reductant. Therefore, even if the element of Group 1B, which is a catalyst, is not exposed in the plating solution, or is not in contact, the reaction for reduction, precipitation and coating of nickel can be performed continuously.

As shown in FIG. 2B, when the surface of the plated metal layer 6 is coated with the gold plated layer 9, the wiring conductor 2 coated with the plated metal layer 6 can be immersed in a substitution type electroless gold plating solution containing at least a gold compound such as gold cyanide potassium, and a complexing agent such as ethylenediamine tetraacetic acid (EDTA) for a predetermined time.

Next, a wiring substrate of a second embodiment of the invention will be described.

In this embodiment, the components corresponding to those in the structure of the first embodiment bear the same reference numeral, and the description thereof will be omitted.

In this embodiment, the structure of the wiring substrate is similar to that of the first embodiment, and the aspect to be noted is that the electroless plated metal layer contains a platinum group metal and is free from lead.

Figure 4A:
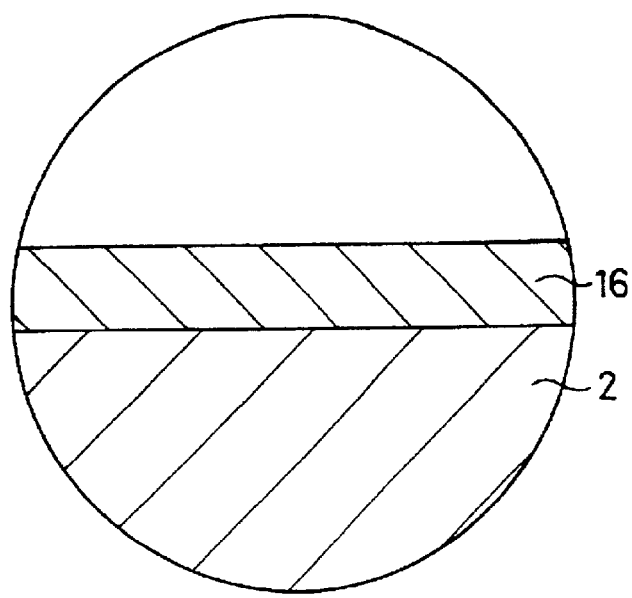
FIG. 4A is an enlarged sectional view showing an enlarged part of a wiring substrate of a second embodiment of the invention.

FIG. 4A is an enlarged sectional view showing an enlarged part of the wiring substrate of the second embodiment of the invention. The surface of the wiring conductor 2 is coated with the plated metal layer 16 by electroless plating, as shown in the sectional view of FIG. 4A. The plated metal layer 16 serves to improve the wettability, the joining strength, and the bonding properties of solders with respect to the wiring conductor 2 and is made of a high purity nickel that contains nickel in a content of 99.9 wt %, a nickel-phosphorus alloy, a nickel-boron alloy, copper, an alloy containing copper as a main component or the like.

In the invention, it is important that the plated metal layer 16 contains a platinum group metal and is free from lead.

This is important in order to prevent the problems that the lead contained in the plated metal layer 16 such as a nickel-boron plated layer moves and is diffused onto the surface of the plated metal layer 16 by heat or the like so that the color is changed spottedly, or the lead harms the human body. In this case, the platinum group metal such as palladium or platinum has a function of providing catalytic activity necessary for the surface of the wiring conductor 2 to be coated with the plated metal layer 16 by electroless plating, and the platinum group metal is precipitated on the surface of the wiring conductor 2 for coating. At the same time, the platinum group metal remains and is contained in the plated metal layer 16. However, compared with lead, the platinum group metals are hardly oxidized, and the toxicity is very low, so that the platinum group metals cannot move and is diffused onto the surface of the plated metal layer 16 so as to cause the spotted color change, nor harm the human body.

It is not necessary that the platinum group metal is formed along the surface of the wiring conductor 2 in the form of a film, and it is sufficient that the platinum group metal is formed uniformly at a substantially constant interval in the form of grains or fragments, for example, in portions along the grain boundaries the crystal grains of the metal having a high melting point of which the wiring conductor 2 is made. The platinum group metal serves as the initiating point to coat the surface of the wiring conductor 2 with the plated metal layer 16 uniformly.

As the platinum group metal, palladium or platinum, in particular, palladium is preferable, because palladium or platinum can coat the surface of the wiring conductor 2 made of a metal having a high melting point satisfactorily, and can provide a satisfactory catalytic activity to form a coating of a metal such as nickel or copper by electroless plating.

Figure 4B:
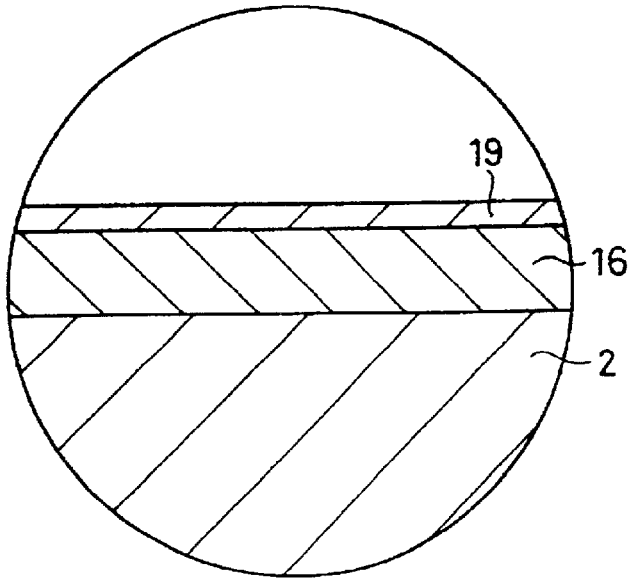
FIG. 4B is an enlarged sectional view showing a part of a variation of the wiring substrate of the second embodiment of the invention.

FIG. 4B is an enlarged sectional view showing a part of a variation of the wiring substrate of the second embodiment of the invention. In the wiring substrate, the surface of the plated metal layer 16 made of pure nickel that contains nickel in a content of 99.9 wt % or more, a nickel-phosphorus alloy, a nickel-boron alloy, a copper, an alloy containing copper as a main component or the like is coated with a gold plated layer 19, the plated metal layer 16 can be prevented from being oxidized and corroded effectively, and the wettability of the solder with respect to the wiring conductor 2 can be improved further. Therefore, it is preferable that the in the wiring substrate 4, the surface of the plated metal layer 16 is further coated with the gold plated layer 19. In this case, when the thickness of the gold layer 19 is less than 0.03 $\mu$m. the effect of coating the plated metal layer 16 is weak, and when the thickness exceeds 0.8 $\mu$m, a large amount of fragile intermetallic compounds is generated between tin in the solder and gold so that the joining strength of the solder tends to deteriorate. Consequently, it is preferable that the thickness of the gold plated layer 19 is in the range from 0.03 $\mu$m to 0.8 $\mu$m.

In this manner, in the wiring substrate of the invention, as shown in FIG. 1, the semiconductor element 3 is mounted on the mounting portion of the insulator 1, and each electrode of the semiconductor element 3 is electrically connected to the wiring conductor 2 via the solder ball 5. Thereafter, a bowl-shaped cover 7 made of a metal or ceramics is joined onto the upper surface of the insulator 1 with a sealing material such as glass, resin, wax material or the like so that the semiconductor element 3 can be accommodated airtightly in a container constituted with the insulator 1 and the cover 7. Thus, a semiconductor apparatus as a product can be completed.

Next, a method for producing the wiring substrate will be described with reference to FIGS. 5A to 5C. The same components as those in FIGS. 1 and 4A bear the same numeral.

Figure 5A:
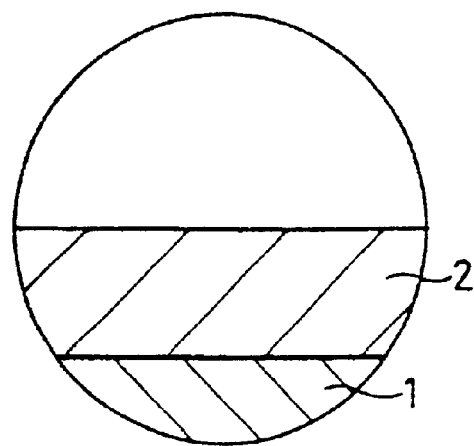
FIGS. 5A to 5C are enlarged sectional views of each process explaining a method for producing the wiring substrate of the second embodiment of the invention.

First, an insulator 1 provided with a wiring conductor 2 made of a metal having a high melting point on its surface as shown in FIG. 5A is prepared.

The insulator 1 is a substantially rectangular plate made of an electrically insulating material such as an aluminum oxide sintered body, an aluminum nitride sintered body, a mullite sintered body, a silicon carbide sintered body or the like, and has a mounting portion for mounting a semiconductor element on its upper surface, so that the semiconductor element is mounted on the mounting portion.

The insulator 1 can be produced in the same manner as in the first embodiment, so that the description thereof will be omitted.

The wiring conductor 2 can be formed in the same manner as in the first embodiment, so that the description thereof will be omitted.

Figure 5B:
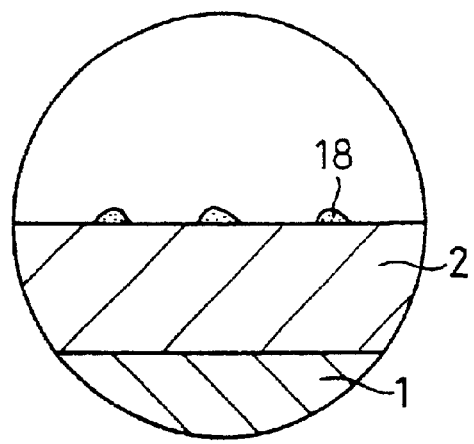
Figure 5C:
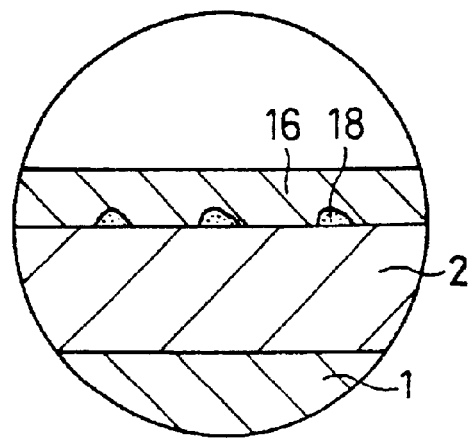

Next, the wiring conductor 2 is immersed into an active liquid containing at least one of the platinum group metals consisting of palladium, platinum, rhodium, ruthenium, and iridium, and at least one hydroxy carboxylic acid such as citric acid and malic acid, and as shown in FIG. 5B, the platinum group metal 18 is formed on the surface of the wiring conductor to provide catalytic activity. In FIG. 5B, the platinum group metal 18 is shown exaggerated than the actual scale for illustration.

In the active liquid, the platinum group metal serves to provide the surface of the wiring conductor 2 with catalytic activity by coating the surface of the wiring conductor 2 with the platinum group metal, and makes it possible to coat selectively and uniformly the surface of the wiring conductor 2 with the plated metal layer 16 in a subsequent process.

The hydroxy carboxylic acid has an important function of making it possible to coat the surface of the wiring conductor 2 with the platinum group metal 18 without letting lead contained in the active liquid. More specifically, the hydroxy carboxylic acid such as citric acid acts on the surface of the wiring conductor 2 made of a metal having a high melting point such as tungsten so that the metal having a high melting point in the surface portion of the wiring conductor 2 is oxidized and complexed so as to be eluted in the active liquid, and that the platinum group metal is reduced and precipitated by being substituted for tungsten or the like in the site from which the metal having a high melting point has been eluted. It seems that this occurs for the following reason: Regarding the stability of a complex of the organic acid such as citric acid with respect to a metal, the stability with respect to the metal having a high melting point such as tungsten is larger than that with respect to an activating agent such as the platinum group metal. Thus, the hydroxy carboxylic acid is added to the active liquid, so that the surface of the wiring conductor 2 can be coated with the platinum group metal easily and uniformly without adding lead as a sensitizing agent to the active liquid.

When palladium, for example, is used as the platinum group metal, an aqueous solution containing at least a palladium compound such as palladium chloride or palladium sulfide, and a hydroxy carboxylic acid (carboxylic acid having a hydroxyl group) such as citric acid or malic acid, to which additives such as a pH adjuster, for example, hydrochloric acid, fluoroboric acid, sodium hydroxide, potassium hydroxide or the like are added, can be used as the active liquid. It is preferable that the concentration of the palladium in the active liquid is about 20 to 80 ppm, because a high concentration may induce a problem such as segregation of the palladium.

Furthermore, in order to achieve the substitution of tungsten with palladium by the action of the hydroxy carboxylic acid effectively, it is preferable that the active liquid is acidic, particularly preferably in the range of pH 1 to 3. In order to adjust the pH of the active liquid to be in the predetermined range, pH adjusters such as hydrochloric acid, fluoroboric acid, sodium hydroxide, and potassium hydroxide can be added to the active liquid, as appropriate.

Then, the wiring conductor 2 is immersed in an electroless plating solution, so that the electroless plated metal layer 16 is precipitated on the surface of the wiring conductor 2 for coating, using the platinum group metal as a catalyst.

The plated metal layer 16 is made of pure nickel that contains nickel in a content of 99.9 wt % or more, a nickel-phosphorus alloy, a nickel-boron alloy, copper, an alloy containing copper as a main component or the like, and serves to improve the wettability, the bonding properties or the like of the solder with respect to the wiring conductor 2.

When the electroless plated metal layer 16 is made of, for example, a nickel-boron alloy, an electroless nickel plating solution containing at least a nickel compound that serves as a nickel supply source such as nickel sulfide, and a boron-based reductant such as dimethylamine boron, to which a complexing agent, a stabilizer, a pH buffer or the like are added, can be used as the electroless plating solution. In this case, the nickel ions in the electroless nickel plating solution are reduced to metal nickel, which occurs together with oxidation and degradation of the reductant by the catalytic action of the platinum group metal that has been previously formed on the surface of the wiring conductor 2 for coating. Then, the surface of the wiring conductor 2 is eutectically coated with the metal nickel together with boron produced from the degradation of the reductant, so that the plated metal layer 16 made of a nickel-boron alloy can be formed. Once that the surface of the wiring conductor 2 is started to be coated with nickel or the nickel-boron alloy, the coated nickel itself has catalytic activity for subsequent reduction and precipitation of nickel by the reductant. Therefore, even if the platinum group metal, which is a catalyst, is not exposed in the plating solution, or is not in contact, the reaction for reduction, precipitation and coating of nickel can be performed continuously.

As shown in FIG. 4B, when the surface of the plated metal layer 16 is coated with the gold plated layer 19, the wiring conductor 2 coated with the plated metal layer 16 can be immersed in a substitution type electroless gold plating solution containing at least a gold compound such as gold cyanide potassium, and a complexing agent such as ethylenediamine tetraacetic acid (EDTA) for a predetermined time.

The wiring substrate of the invention is not limited to the embodiments described above, and it is possible to make various changes as long as the changes do not depart from the gist of the invention. For example, in the embodiments, the wiring substrate of the invention is applied to a semiconductor element accommodation package for accommodating a semiconductor element, but the wiring substrate of the invention can be applied to other applications such as a hybrid integrated circuit.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A wiring substrate comprising:

an insulator;

a wiring conductor made of a metal having a high melting point formed on the insulator;

an element of Group 1B precipitated on a surface of the wiring conductor; and a lead-free electroless plated metal layer formed on the wiring conductor covering the element of Group 1B existing on, the surface of the wiring conductor, wherein the element of Group 1B has served as an initiating point to coat the surface of the wiring conductor with the lead-free electroless plated metal layer, the element of Group 1B is precipitated in a site from which the metal having a high melting point on the surface of the wiring conductor has been eluted.

2. The wiring substrate of claim 1, wherein the insulator is made of an aluminum oxide sintered body, an aluminum nitride sintered body, a muillite sintered body, or silicon carbide sintered body, the wiring conductor is made of tungsten, molybdenum, or manganese, the lead-free electroless plated metal layer is made of a high purity nickel containing nickel in a content of 99.9 wt % or more, a nickel-phosphorus alloy or a nickel-boron alloy.

3. The wiring substrate of claim 2, wherein a surface of the lead-free electroless plated metal layer is coated with a gold plated layer.

4. A wiring substrate comprising:

an insulator;

a wiring conductor made of a metal having a high melting point formed on the insulator;

an element of the platinum group precipitated on a surface of the wiring conductor; and a lead-free electroless plated metal layer formed on the wiring conductor covering the element of the platinum group existing on the surface of the wiring conductor, wherein the element of the platinum group has been precipitated from a solution containing the element of the platinum group and a hydroxy carboxylic acid, and has served as an initiating point to coat the surface of the wiring conductor with the lead-free electroless plated metal layer.

5. The wiring substrate of claim 4, wherein the insulator in made of an aluminum oxide sintered body, an aluminum nitride sintered body, a mullite sintered body, or silicon carbide sintered body, the wiring conductor is made of tungsten, molybdenum, or manganese, the lead-free electroless plated metal layer is made of a high purity nickel containing nickel in a content of 99.9 wt % or more, a nickel-phosphorus alloy, a nickel-boron alloy, copper, or an alloy containing copper as a main component.

6. The wiring substrate of claim 4, wherein a surface of the wiring conductor with the lead-free electroless plated metal layer is coated with a gold plated layer.

7. A wiring substrate comprising:

an insulator;

a wiring conductor made of a metal having a high melting point formed on the insulator;

an element of Group 1B precipitated on a surface of the wiring conductor; and a lead-free electroless plated metal layer formed on the wiring conductor covering the element of Group 1B existing on the surface of the wiring conductor, wherein the element of Group 1B has served as an initiating point to coat the surface of the wiring conductor with the lead-free electroless plated metal layer, the element of Group 1B has been precipitated from a solution containing the element of the Group 1B and a hydroxyl carboxylic acid.

* * * * *